United States Patent
Pan et al.

(10) Patent No.: US 6,686,761 B2
(45) Date of Patent: Feb. 3, 2004

(54) METHOD FOR DETERMINING WHETHER A ROTOR IS GOOD IN MAGNETIC INDUCTION BY MEASURING THE EMF OF A MOTOR

(75) Inventors: Yann-Guang Pan, Taipei (TW); Jieh-Yee Huang, Kaohsiung (TW); Li-Te Kuo, Nan-Tau Hsien (TW); Shyh-Jier Wang, Hsin-Chu Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 125 days.

(21) Appl. No.: 10/062,786

(22) Filed: Jan. 29, 2002

(65) Prior Publication Data

US 2002/0097066 A1 Jul. 25, 2002

Related U.S. Application Data

(63) Continuation-in-part of application No. 09/642,465, filed on Aug. 17, 2000, now abandoned.

(30) Foreign Application Priority Data

Jun. 27, 2000 (TW) ........................................ 89112576 A

(51) Int. Cl.⁷ .......................... G01R 31/34; G01R 31/06
(52) U.S. Cl. ........................ 324/772; 324/545; 310/179; 73/116; 318/798
(58) Field of Search .......................... 324/772, 90, 545, 324/546, 555; 73/116; 310/179; 318/798

(56) References Cited

U.S. PATENT DOCUMENTS

| | | | | |
|---|---|---|---|---|
| 2,568,406 A | * | 9/1951 | Packer et al. | 324/545 |
| 3,875,511 A | * | 4/1975 | Sims | 324/772 |
| 4,204,425 A | * | 5/1980 | Mallick, Jr. | 73/116 |
| 4,422,040 A | * | 12/1983 | Raider et al. | 324/772 |
| 4,743,848 A | * | 5/1988 | Krimm et al. | 324/772 |
| 4,744,041 A | * | 5/1988 | Strunk et al. | 702/84 |
| 5,041,749 A | * | 8/1991 | Gaser et al. | 310/156.22 |
| 5,404,108 A | * | 4/1995 | Storar | 324/546 |

* cited by examiner

*Primary Examiner*—Kamand Cuneo
*Assistant Examiner*—Paresh Patel
(74) *Attorney, Agent, or Firm*—W. Wayne Liauh

(57) ABSTRACT

The invention pertains to a method for determining whether a rotor is good in magnetic induction by measuring the electromotive force (emf) of a motor. A standard stator of the motor is prepared as the standard of measurement. A set of induction coil is wound upon the standard stator so that when the rotor is combined with the standard stator and is subject to running by a driver, the induction coil can detect the back-emf signal generated by the rotor, by which the rotor quality can be determined. Since the measuring method disclosed in the invention is performed within the closed system composed of the rotor and the stator, the result is not only close to a real motor in rotation, the detection is simple and free from the problem of axis alignment. Thus, this method can increase the production efficiency of the product line.

15 Claims, 5 Drawing Sheets

METHOD FOR DETERMINING WHETHER A ROTOR IS GOOD IN MAGNETIC INDUCTION BY MEASURING THE EMF OF A MOTOR

This application is a continuation-in-part of 09/642,465 filed Aug. 17, 2000 now abandoned.

BACKGROUND OF THE INVENTION

1. Field of Invention

The present invention relates to a method for determining the quality of a motor and, in particular, to a method for discerning the quality of a rotor by winding an induction coil on a stator and measuring the electromotive force of the motor.

2. Related Art

Currently, development in information recording media aims at high-density data storage density, data transmission speed has to become faster too. Correspondingly, the rotational speed of the main-axis motor on the storage device such as an optical disk drive or DVD has to be able to satisfy such a requirement. Therefore, the quality and characteristic of the main-axis motor are very important factors.

One factor that has great influence on the motor characteristic is the back-emf constant Ke of the motor. In the MKS system, it is numerically identical to the torque constant Kt. Since the back-emf Ke is a load for the external voltage applied to the motor, the external voltage V has to be greater than the back-emf so that the motor can function in the form of a motor. Otherwise, it would be running like an alternator. One then knows that only the difference between the external voltage and back-emf can provide a current on the motor coil and have a torque output. Furthermore, one intuitively thinks that a motor with a large Kt value can obtain a constant torque with an extremely small current. However, the Ke value also increases. That is, a tiny rotational speed can make the back-emf greater than the external voltage. Under such a condition, the achieved rotational speed is certainly low and unsatisfactory. Thus, the value of Ke actually determines the rotational speed and the torque character of the motor.

There are two major methods of measuring the value of Ke. Referring to FIG. 1, the first method is to use an active motor 11 to drive a test motor 12 into rotation so as to measure the back-emf of the stator in the motor 12 (Eb in the drawing) and thus the Ke value. Although this method can have fairly accurate results, the driving of the active motor 11 on the motor 12 is mediated through a connection axis. Thus, there is the problem of axis alignment. If improperly manipulated, the connection axis will affect the measurement and do harm to the rotational axis of the motor 12. Moreover, the industry can not test the motor rotor immediately after it is made. The rotor can be tested only after a set of motors 12 are assembled. If there is any problem, the whole set of motors 12 has to be thrown away and invested product line equipment has to be adjusted. Since an active motor 11 is employed to drive test motors 12, the testing costs more time.

Please refer to FIG. 2. Another conventional method is to measure a single test motor rotor 22 using a Gauss meter 21 to obtain the magnetic flux density B. Yet this method is not measuring the result of a rotor and stator system under operation, the obtained result will be quite different from the actual situation. That is, it is impossible to measure the back-emf generated due to the magnetic force line crossing between the rotor and the stator.

SUMMARY OF THE INVENTION

In view of the foregoing, it is an object of the invention to provide a method for determining the magnetic induction of a rotor along, whose result is not different from directly measuring the motor under actual operation. This method can control the stability of the motor quality.

Pursuant to the above object, the invention provides a method for discerning whether a rotor is good in magnetic induction by measuring the electromotive force of the motor. According to the disclosed technology, a motor standard stator is manufactured to be the standard of all test rotors. In addition to driving coils, the standard stator is further coiled with a set of induction coil on its teeth. When a user wants to test the quality of a rotor, he only needs to combine the test rotor with the standard stator. A driving voltage is provided to the driving coil through a driver to rotate the rotor. Through the induction of the induction coil, the back-emf signal generated by the test rotor is given out. The back-emf signal is also retrieved and converted into a physical signal related to the motor rotational speed. By computing the back-emf signal, the physical signal and the ratio of coil rounds on the driving coil and the induction coil, the back-emf constant of the motor can be obtained. Therefore, the disclosed method can discern the quality of motors.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow illustration only, and thus are not limitative of the present invention, and wherein.

In the various drawings, the same references relate to the same elements.

DETAILED DESCRIPTION OF THE INVENTION

Figure 2:
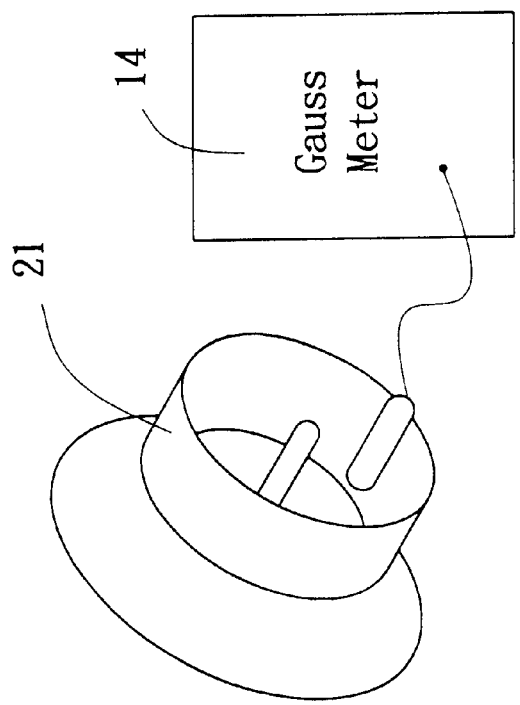
FIG. 2 shows a schematic view of the second method for measuring the back-emf of motors.
Figure 1:
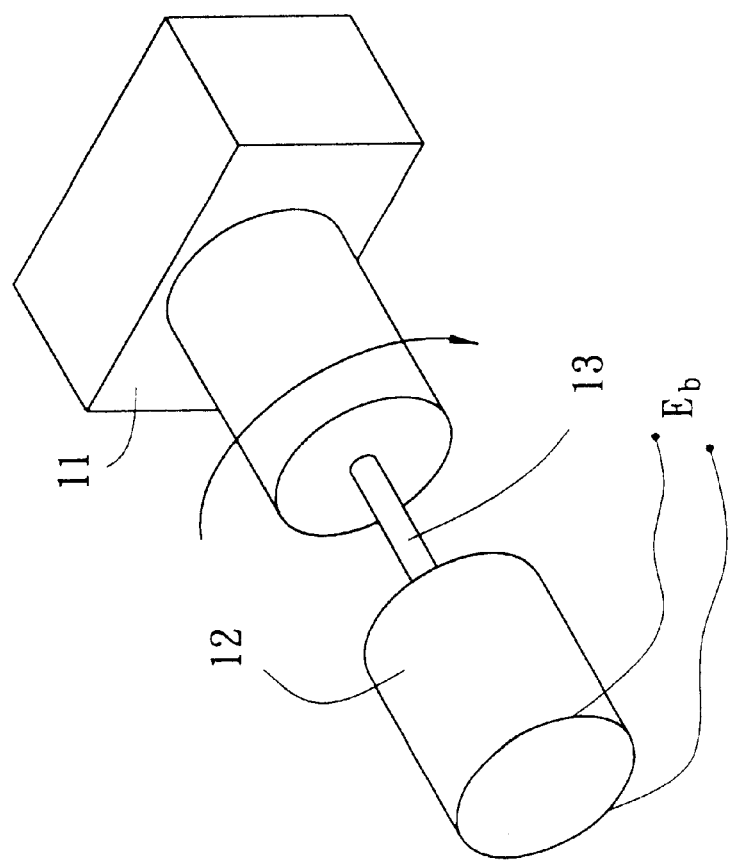
FIG. 1 shows a schematic view of the first method for measuring the back-emf of motors.
Figure 3:
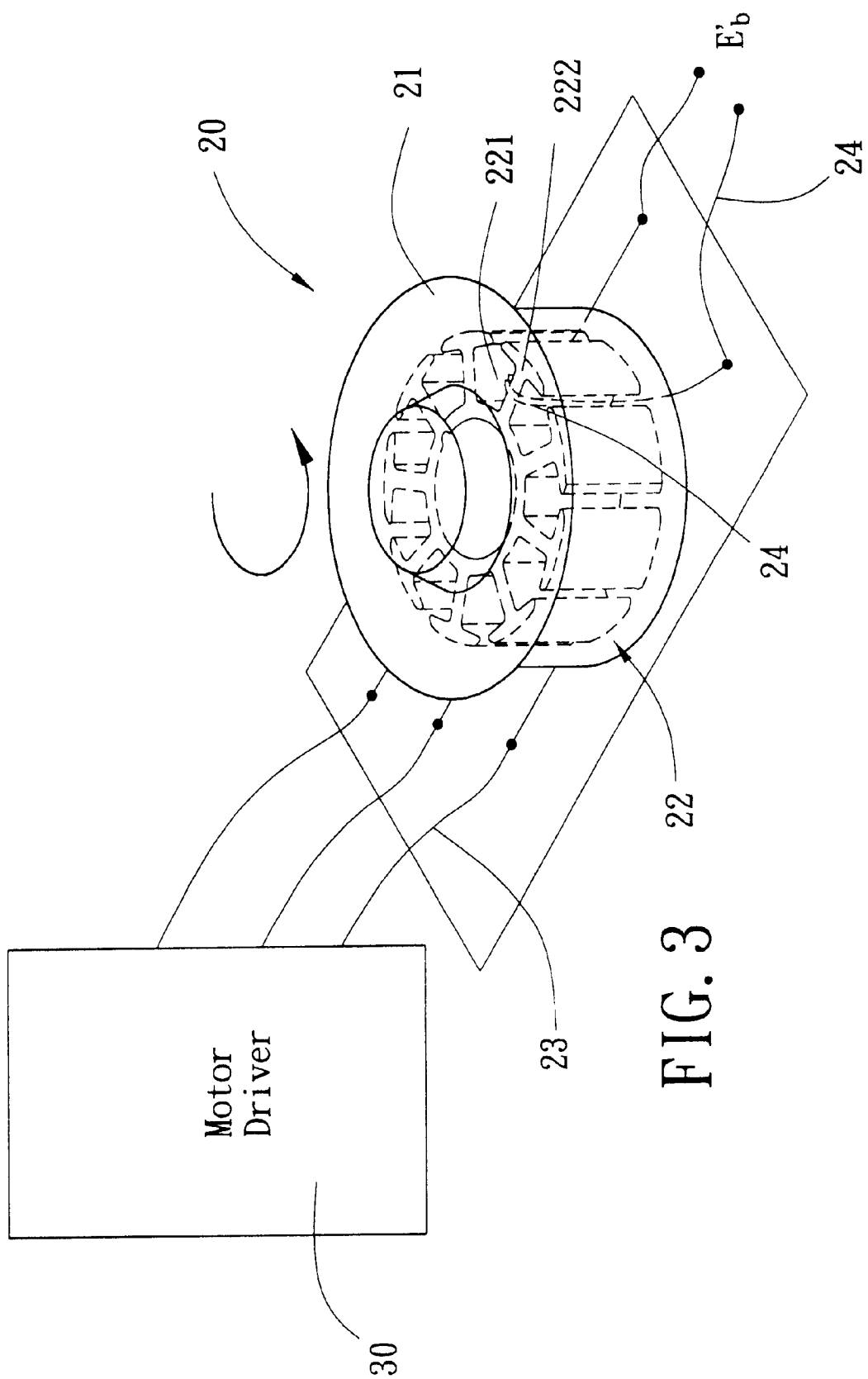
FIG. 3 shows a schematic view of measuring the back-emf of motors according to the invention.

Referring to FIG. 3, the disclosed technology takes a standard stator 22 as the standard for testing many test rotors 21. The standard stator 22 comprises a plurality of stator grooves 221 and the same number of stator teeth 222 for separating the plurality of stator grooves. In addition to driving coils 23 on the plurality of stator teeth 222, a set of induction coil 24 is also wound thereon. When a driver 30 provides a driving voltage to the standard stator 22, the electromagnetic action of the driving voltage generates different electromagnetic poles on the driving coil 23 wound stator teeth 222. The electromagnetic poles of the stator teeth 222 will interact with the magnetic poles of the magnets of the test rotor 21, pushing the test rotor 21 into rotation in the standard stator 22. In rotation, the relative motion of the test rotor 21 to the standard stator 22 results in magnetic force line crossing, which generates a back-emf signal (Eb' in the drawing). The invention measures the back-emf signal using the induction coil 24 and outputs the result.

The above measurement method can be applicable to all sorts of motors. According to the product types, they can be the main-axis motors of DVD or CD-ROMs. According to the phases of the driving voltages, they can be motors of a single phase, dual phases, or multiple phases. In other words, as long as the test motor product contains a rotor and a stator, the disclosed method can be used to test the quality during the production.

Figure 4:
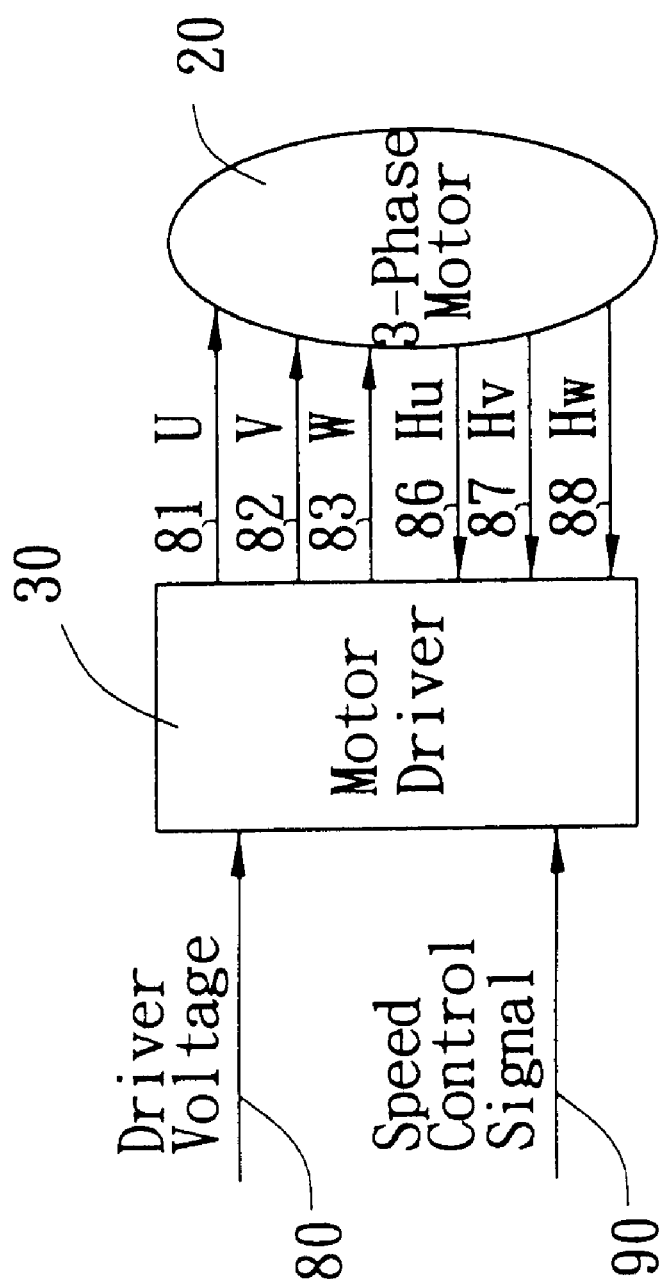
FIG. 4 shows a schematic view of signal transmission in FIG. 3.

In practice, the signal transmission relation between the driver 30 and the motor 20 can be explained using the following three-phase motor 20 as an example. With reference to FIG. 4, three-phase Hall device signals Hu 86, Hv 87 and Hw 88 are continuously fed back to the driver 30 during the operation of the motor 20. The driver 30 determines where the test rotor 21 rotates to, whose result is used to distribute the driving voltage 80 to a U phase voltage 81, a V phase voltage 82 or a W phase voltage 83 through three terminals so that the driving voltage 80 can keep the motor 20 running all the time in the change of three phases. Therefore, the induction coil 24 can sense the back-emf signal generated by the motor rotation. The rotational speed of the motor 20 can be adjusted using a speed control signal 90 that is input to the driver 20.

In short, the Hall device signals 86, 87, 88 are used for positioning the rotor 21. Aside from the above-mentioned positioning method, an encoder can be added into the motor and a small hole can be inscribed on the wall of the rotor 21. By emitting light or electric force lines from the encoder to the rotor 21, one can also achieve positioning with the interaction between the small hole and the light or the electric force lines.

Figure 5B:
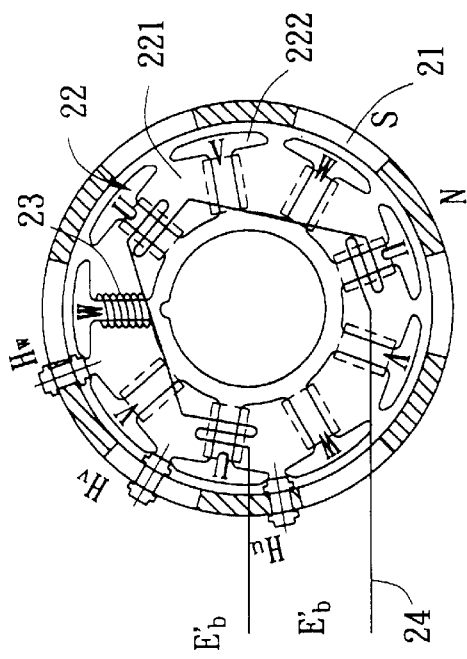
FIG. 5B shows a schematic view of a second coiling method of the induction coil in the invention.
Figure 5D:
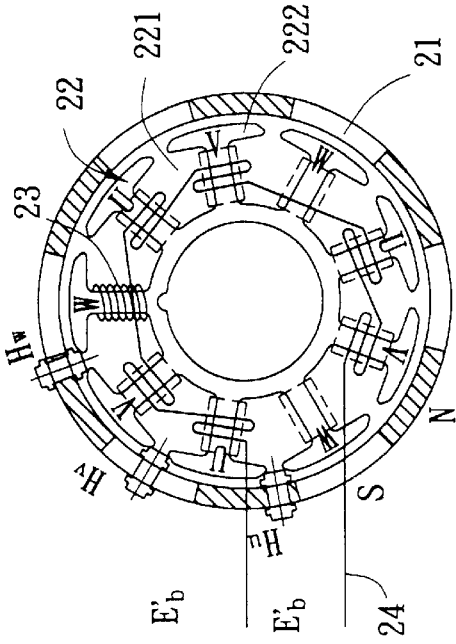
FIG. 5D shows a schematic view of a fourth coiling method of the induction coil in the invention.
Figure 5A:
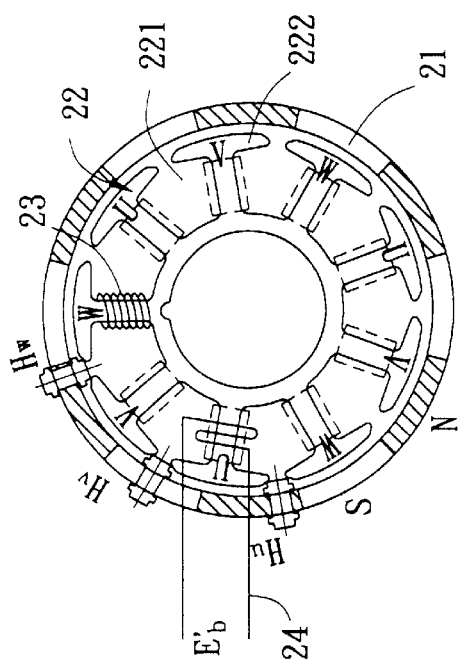
FIG. 5A shows a schematic view of a first coiling method of the induction coil in the invention.
Figure 5C:
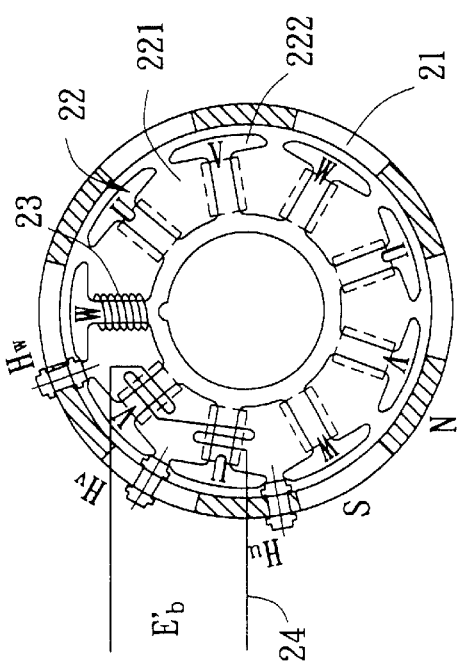
FIG. 5C shows a schematic view of a third coiling method of the induction coil in the invention.

The winding method of the induction coil 24 in the invention can vary in accordance with the motor type or practical situations. A three-phase motor 20 is again taken as an example to describe some of the preferred embodiments of the invention. FIG. 5A shows a three-phase motor 20 with nine stator grooves 221 and stator teeth 222. Driving coils 23 of the three phases are intertwined on the nine stator teeth 222 so that the corresponding stator teeth 222 generate electromagnetic poles with the U, V or W phase. Therefore, the induction coil 24 can only wound on one of the stator teeth 222. For example, it can be wound on a U-phase stator tooth 222. Alternatively, it can be simultaneously wound on three U-phase stator teeth 222, as shown in FIG. 5B. It can be wound on two neighboring U-phase and V-phase stator teeth 222, as shown in FIG. 5C. Analogously, it can be simultaneously wound on three pairs of neighboring U-phase and V-phase stator teeth 222.

The described embodiments include only a small fraction of all possible winding methods of the invention. In other words, one can wind the induction coil 24 on one, two or three W-phase stator teeth 222 or simultaneously on one pair, two pairs or three pairs of V-phase and W-phase stator teeth 222. In any case, the invention can be properly implemented as long as the winding of the induction coil 24 does not cancel the measured back-emf. For instance, if the induction coil 24 is wound on a set of U-phase, V-phase and W-phase stator teeth, the back-emf measured would be zero. That is to say the winding method of the induction coil 24 in the invention can be, in terms of the number of phases in the motor, single phase single tooth, single phase multiple teeth, dual phases dual teeth, dual phases multiple teeth or even multiple phase single tooth and multiple phase multiple teeth.

Figure 6:
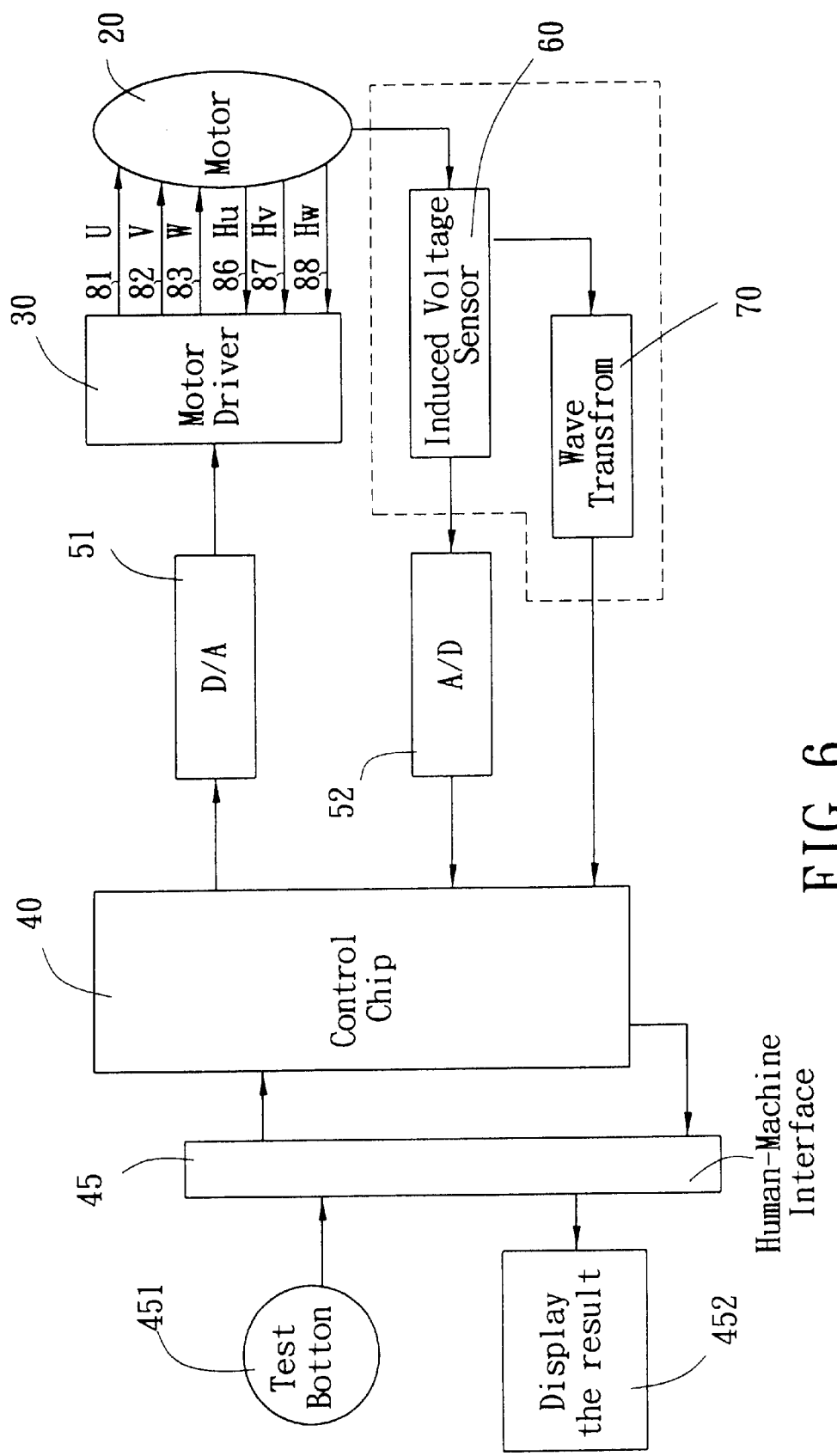
FIG. 6 shows a schematic functional block of the invention applied to a system.

FIG. 6 shows a schematic functional block of the invention applied to a system. When a user wants to test whether the produced motor rotor satisfies required specifications, he only needs to put the test rotor on the standard stator 22 to form a motor 20. The user then presses a test key 451 on an operation interface 45 to enter command signals to a control unit 40. The command signals are converted by a digital-to-analogue signal converter (DAC) 51 from digital ones to analogue ones, which are then output to the driver 30. The driver 30 provides the three-phase driving voltages 81, 82, 83 to the motor 20 according to the signals (it is assumed that the tested motor is also a three-phase motor 20). As described hereinbefore, the motor 20 will feed back three-phase Hall device signals 86, 87, 88 to the driver 30 to keep the motor 20 rotating or to control its speed. When the motor 20 rotates for a period of time, the induction coil 24 will detect a back-emf signal and send the signal to a detector 60. On one hand, the back-emf signal passes through an analogue-to-digital signal converter (ADC) 51 so as to be converted from analogue signals into digital ones, which are output to the control unit 40. On the other hand, an operational amplifier 70 simultaneously extract the back-emf signal and converts it into a physical quantity that is proportional to the motor rotational speed and is output to the control unit 40. The control unit 40 integrates the obtained back-emf signal, the physical quantity that is proportional to the motor rotational speed, the winding ratio of the driving coil 23 and the induction coil 24 to compute the back-emf constant Ke for the motor 20 in actual operation. It is then output to a display 452 on the operation interface 45. The user can determine whether the test rotor 21 is good in its magnetic property by observing the monitor 452.

More specifically, in the present invention the coil the back-emf constant Ke is calculated according to the following formula:

$$Ke=Eb/\omega$$

where Eb is the back-emf signal of the moter and $\omega$ is the rotational speed of the motor.

Furthermore, since $Eb=N*d\lambda/dt$, and $\omega=d\theta/dt$ ($\lambda$ is the magnetic flux of the motor, $\theta$ is the shift angle of the motor, and t is time), the following derivations can be made:

$$N*d\lambda/dt=Eb$$

$$N*d\lambda/d\theta*d\theta/dt=Eb$$

$$N*d\lambda/d\theta*\omega=Eb$$

$$Ke=Eb/\omega=N*d\lambda/d\theta$$

Thus, $$d\lambda/d\theta=Ke/N$$

Therefore, in the present invention, the quality of the motor rotor $d\lambda/d\theta$ can be calculated by dividing the back-emf constant Ke by the winding ratio between the driving coil and the induction coil, N.

Similarly, FIG. 6 only depicts one embodiment of the invention. Since the driver 30 can rectify rectangular waves, the back-emf signal can be directly output to the driver 30 and the needed physical quantity can be output to the control unit 40 through the driver 30. The rectangular wave rectifying effects of the driver 30 are nevertheless not so good. It is preferable to process the rectangular wave rectification individually.

There is a small defect in the above method of winding an additional induction coil 24 on the stator teeth 222. That is the induction coil 24 does only measure the back-emf generated by the rotating test rotor 21, but also includes the current-excited magnetism on the driving coil 23 itself. Thus, the result is slightly different from the pure back-emf signal. However, the influence of the current-excited magnetism on the induction coil 24 is not large. It is experimentally tested to contribute about one tenth of the total result. Also, the object of the invention is not to measure a very accurate back-emf constant but to ensure the stability of the quality of produced motors 20. Accordingly, if the computed back-emf constant is within a standard range in practice, the motor is considered as a good product.

Effects of the Invention

In the disclosed method, s standard stator is provided and a set of induction coil is included in addition to the original driving coil. This method is featured in that:

The invention is implemented in a closed system composed of a rotor and a stator. The measured back-emf constant is therefore closer to the result of a real motor in rotation.

The invention can test individual rotors. It is convenient and does not have such problem of axis alignment. Using this method can save the time and facilitate mass production.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for examining whether the magnetic property of a rotor is good by measuring the electromotive force (emf) of a motor and determining the quality of the motor rotor from the measured back-emf constant, the method comprising:

preparing a standard stator that contains at least a driving coil of one phase and at least an induction coil wound thereon;

combining a test rotor with the standard stator and providing at least a driving voltage of one phase to the corresponding driving coil on the standard stator using a driver so as to rotate the test rotor;

generating a back-emf signal from the test rotor and outputting the back-emf signal through the induction coil;

measuring the rotational speed of the motor;

computing the back-emf constant of the motor by dividing the back-emf signal by the rotational speed of the motor; and determining the quality of the test rotor by dividing the back-emf constant of the motor by the winding ratio between the driving coil and the induction coil.

2. The method according to claim 1, wherein the standard stator comprises a plurality of stator grooves and the same number of stator teeth respectively separated by the plurality of stator grooves.

3. The method according to claim 2, wherein at least a driving coil of one phase is wound on each of the plurality of stator teeth and at least a driving voltage of one phase is employed to generate at least a one-phase electromagnetic pole on the plurality of stator teeth.

4. The method according to claim 2, wherein an induction coil is wound on at least one stator tooth of the plurality of stator teeth.

5. The method according to claim 1, wherein the motor is structured to send out at least one Hall device signal to the driver to notify the driver the current position of the test rotor, so as to determine the phase of the driving voltage that enters the motor.

6. The method according to claim 5, wherein the number of the Hall device signals sent out by the motor is the same as the number of phases in the driving voltage.

7. The method according to claim 1, wherein an encoder is added to the motor to emit light or an electric field to the test rotor so as to locate the position of the test rotor and to feed back to the driver so as to determine the phase of the driving voltage that enters the motor.

8. The method according to claim 7, wherein the encoder projects light on a small hole inscribed on the wall of the test rotor so as to locate the position of the test rotor.

9. The method according to claim 1, wherein the back-emf signal measured by the induction coil of the motor is output to a control unit through a detector.

10. The method according to claim 9, wherein an analog-to-digital signal converter is added between the motor and the control unit for converting the analogue signals from the motor to digital signals and outputting them to the control unit.

11. The method according to claim 9, wherein the control unit can enter a speed control signal to the driver to control the rotational speed of the motor.

12. The method according to claim 9, wherein a digital-to-analog signal converter is added between the control unit and the driver for converting the digital signals from the control unit into analogue signals and outputting them to the driver.

13. The method according to claim 9, wherein a human-machine operation interface is further included and the operation interface comprises an input device and an output device as the communication interface between the user and the control unit.

14. The method according to claim 13, wherein the input device is a test key and the output device is a display.

15. The method according to claim 9, wherein the rotational-speed-related physical signal is computed by a wave transform and output to the control unit.

* * * * *